(12) United States Patent
Seo et al.

(10) Patent No.: US 7,515,487 B2
(45) Date of Patent: Apr. 7, 2009

(54) INTERNAL REFERENCE VOLTAGE GENERATING CIRCUIT FOR REDUCING STANDBY CURRENT AND SEMICONDUCTOR MEMORY DEVICE INCLUDING THE SAME

(75) Inventors: Young-Hun Seo, Suwon-si (KR); Dong-Il Seo, Yongin-si (KR); Kyu-Chan Lee, Seoul (KR); Jong-Hyun Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/567,826

(22) Filed: Dec. 7, 2006

(65) Prior Publication Data

US 2007/0153590 A1    Jul. 5, 2007

(30) Foreign Application Priority Data

Dec. 30, 2005    (KR) ...................... 10-2005-0135870

(51) Int. Cl.
*G11C 5/14* (2006.01)
(52) U.S. Cl. .................. 365/189.09; 327/540; 327/541; 326/30
(58) Field of Classification Search ............ 365/189.09; 327/540, 541; 326/30
See application file for complete search history.

(56) References Cited

U.S. PATENT DOCUMENTS

| 7,034,567 | B2 * | 4/2006 | Jang ............................ 326/30 |
| 7,362,622 | B2 * | 4/2008 | Braun et al. ........... 365/189.09 |
| 2004/0108890 | A1 * | 6/2004 | Choi et al. ................... 327/541 |

FOREIGN PATENT DOCUMENTS

| JP | 2004-327030 | 11/2004 |
| KR | 100269313 | 7/2000 |
| KR | 1020010087643 | 9/2001 |

* cited by examiner

*Primary Examiner*—Hoai V Ho
*Assistant Examiner*—Fernando N Hidalgo
(74) *Attorney, Agent, or Firm*—F. Chau & Assoc., LLC

(57) ABSTRACT

An internal reference voltage generating circuit that reduces a standby current and the number of pins of a semiconductor memory device, in which a reference voltage is provided to an input buffer that receives a signal through an input to which an on die transmitor resistor is connected, includes: a voltage dividing circuit outputting the reference voltage by a power voltage; a pull down driver connected to an end of the voltage dividing circuit; and a calibration control circuit comparing a voltage level of the input and a voltage level of an end of the voltage dividing circuit, and controlling the on resistor value of the pull down driver according to a result of the comparison. The internal reference voltage generating circuit is operated while the memory controller inputs a signal into a mode register set (MRS) to enable the internal reference voltage generating circuit and the output signal of the MRS is activated.

10 Claims, 4 Drawing Sheets

INTERNAL REFERENCE VOLTAGE GENERATING CIRCUIT FOR REDUCING STANDBY CURRENT AND SEMICONDUCTOR MEMORY DEVICE INCLUDING THE SAME

CROSS-REFERENCE TO RELATED PATENT APPLICATION

This application claims priority from Korean Patent Application No. 10-2005-0135870, filed on Dec. 30, 2005, in the Korean Intellectual Property Office, the disclosure of which is incorporated herein in its entirety by reference.

BACKGROUND OF THE INVENTION

1. Technical Field

The present disclosure relates to a reference voltage generating circuit and, more particularly, to an internal reference voltage generating circuit for an input buffer of a high-speed semiconductor memory device, and a semiconductor memory device including the same.

2. Discussion of the Related Art

Owing to the development of mobile systems, the demand for semiconductor memory devices operated on a high-speed low voltage has increased. Conventional semiconductor memory devices operated on such a high-speed low voltage stably receive input signals having a small swing width using input buffers based on a predetermined reference voltage.

The reference voltage of the input buffers, however, is generated outside the conventional semiconductor memory devices and is then supplied to the conventional semiconductor memory devices.

FIG. 1 is a block diagram showing an external reference voltage generating circuit 15 and a semiconductor memory device 100 that receives a reference voltage from the external reference voltage generating circuit 15. Referring to FIG. 1, the external reference voltage generating circuit 15 is formed on a printed circuit board (PCB) outside the semiconductor memory device 100 and generates the reference voltage VREF. The external reference voltage generating circuit 15 applies the reference voltage VREF to the semiconductor memory device 100 through a reference voltage input pin REFIN. Input buffers 11 and 13 then receive the reference voltage VREF.

The external reference voltage generating circuit 15 includes resistors R1 and R2 serially connected to a power voltage VCC and a ground voltage VSS, and generates the reference voltage VREF at a connection point of the resistors R1 and R2. The external reference voltage generating circuit 15 provides the reference voltage VREF to the semiconductor memory device 100 and to a memory controller (not shown) that controls the semiconductor memory device 100.

The semiconductor memory device 100 requires the reference voltage input pin REFIN since the reference voltage VREF is generated from outside the semiconductor memory device 100. Also, a standby current flows from the power voltage VCC to the ground voltage VSS in the external reference voltage generating circuit 15, thereby causing an increase in power consumption of the semiconductor memory device 100.

SUMMARY OF THE INVENTION

Exemplary embodiments of the present invention provide an internal reference voltage generating circuit that reduces a standby current and reduces the number of pins of a semiconductor memory device.

Exemplary embodiments of the present invention provide a semiconductor memory device including an internal reference voltage generating circuit that reduces a standby current and reduces the number of pins of the semiconductor memory device.

According to an exemplary embodiment of the present invention, there is provided an internal reference voltage generating circuit of a semiconductor memory device providing a reference voltage to an input buffer that receives a signal through an input to which an on die termination (ODT) resistor is connected, the circuit comprising: a voltage dividing circuit outputting the reference voltage by distributing voltages; and a pull down driver connected to the voltage dividing circuit wherein the pull down driver is turned on or off according to a command applied from outside the semiconductor memory device.

The voltage dividing circuit may comprise: a plurality of resistors serially connected between a power voltage and the pull down driver, wherein the reference voltage is output from one of contact points of the plurality of resistors, and the total sum of values of the plurality of resistors is the same as a value of the ODT resistor.

The command is a write command by which the pull down driver is turned on.

The pull down driver has the same on resistor value as an on resistor value of a pull down driver of an output driver of the memory controller that transmits data to the input of the semiconductor memory device.

According to an exemplary embodiment of the present invention, there is provided an internal reference voltage generating circuit of a semiconductor memory device providing a reference voltage to an input buffer that receives a signal through an input to which an ODT resistor is connected, the circuit comprising: a voltage dividing circuit outputting the reference voltage by distributing voltages; a pull down driver connected to the voltage dividing circuit; and a calibration control circuit comparing a voltage level of the input with a voltage level of an end of the voltage dividing circuit, and controlling the on resistor value of the pull down driver according to a result of the comparison.

The voltage dividing circuit comprises: a plurality of resistors serially connected between a power voltage and the pull down driver, wherein the reference voltage is output from one of contact points of the plurality of resistors, and the total sum of values of the plurality of resistors is the same as a value of the ODT resistor.

The pull down driver comprises: a plurality of pull down transistors in parallel connected between an end of the voltage dividing circuit and a ground voltage, and is turned on or off in response to control code signals, respectively.

The calibration control circuit controls the pull down driver to have the same on resistor value as an on resistor value of a pull down driver of an output driver of a memory controller that transmits data to the semiconductor memory device.

According to an exemplary embodiment of the present invention, there is provided a semiconductor memory device comprising: an input end; an ODT resistor connected to the input end; an input buffer that receives a signal through the input end based on a reference voltage; and an internal reference voltage generating circuit that generates the reference voltage, wherein the internal reference voltage generating circuit comprises: a voltage dividing circuit outputting the reference voltage by distributing voltages; a pull down driver connected to an end of the voltage dividing circuit, wherein the pull down driver is turned on or off according to a command applied from outside.

The voltage dividing circuit comprises: a plurality of resistors serially connected between a power voltage and the pull down driver, wherein the reference voltage is output from one of contact points of the plurality of resistors, and the total sum of values of the plurality of resistors is the same as a value of the ODT resistor.

The command is a write command by which the pull down driver is turned on.

The pull down driver has the same on resistor value as an on resistor value of a pull down driver of an output driver of a memory controller that transmits data to the input end.

According to an exemplary embodiment of the present invention, there is provided a semiconductor memory device comprising: an input end; an ODT resistor connected to the input end; an input buffer that receives a signal through the input end based on a reference voltage; and an internal reference voltage generating circuit that generates the reference voltage, wherein the internal reference voltage generating circuit comprises: a voltage dividing circuit outputting the reference voltage by distributing voltages; a pull down driver connected to an end of the voltage dividing circuit; and a calibration control circuit comparing a voltage level of the input end and a voltage level of an end of the voltage dividing circuit, and controlling the on resistor value of the pull down driver according to a result of the comparison.

The voltage dividing circuit comprises: a plurality of resistors serially connected between a power voltage and the pull down driver, wherein the reference voltage is output from one of contact points of the plurality of resistors, and the total sum of values of the plurality of resistors is the same as a value of the ODT resistor.

According to an exemplary embodiment of the present invention, the pull down driver comprises: a plurality of pull down transistors in parallel connected between an end of the voltage dividing circuit and a ground voltage, and respectively turned on or off in response to control code signals.

The calibration control circuit comprises: a voltage comparator a voltage level of the input end and a voltage level of an end of the voltage dividing circuit; and a control code generating circuit generating the control code signals in response to an output of the voltage comparator.

The calibration control circuit controls the pull down driver to have the same on resistor value as an on resistor value of a pull down driver of an output driver of a memory controller that transmits data to the semiconductor memory device.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
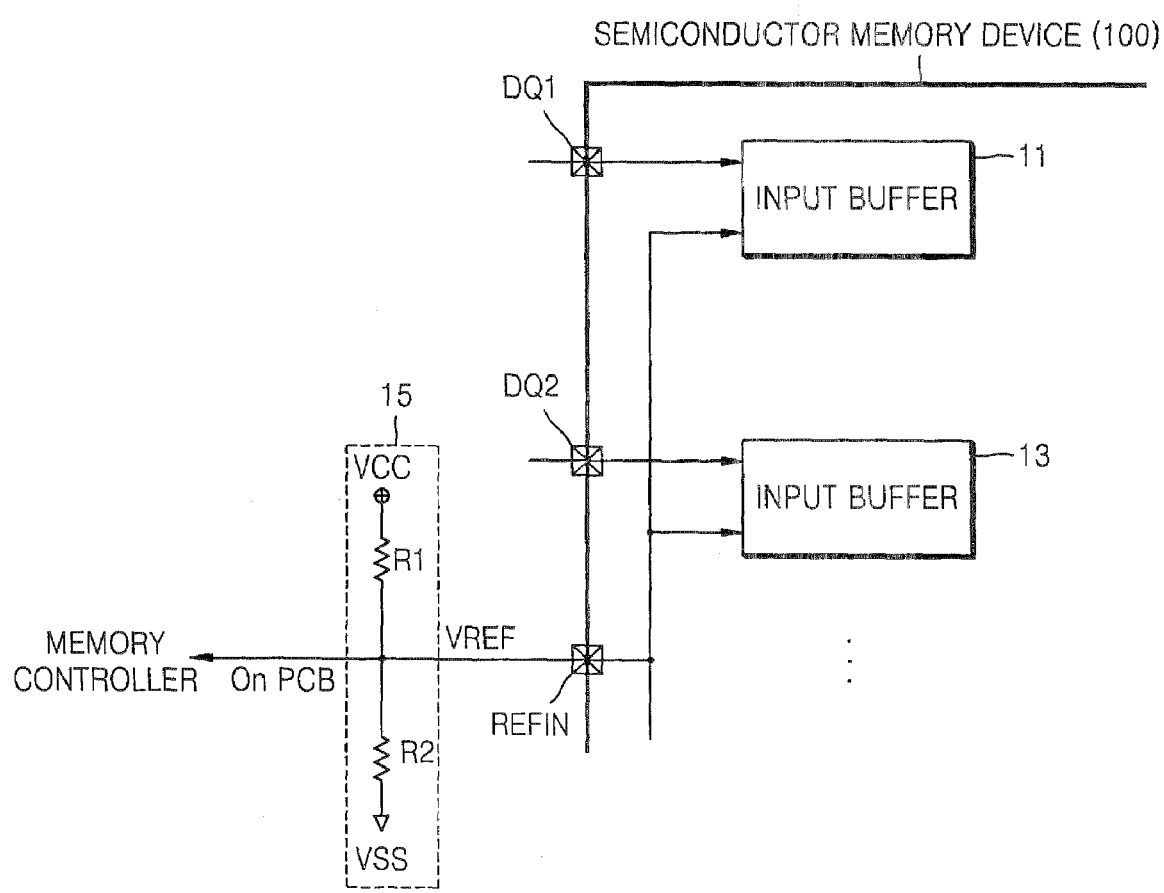
FIG. 1 is a block diagram of a known external reference voltage generating circuit and a semiconductor memory device that receives a reference voltage from the external reference voltage generating circuit.

Hereinafter, exemplary embodiments of the present invention will be described in detail with reference the accompanying drawings. Like reference numerals are used to designate like or equivalent elements throughout this disclosure.

Figure 2:
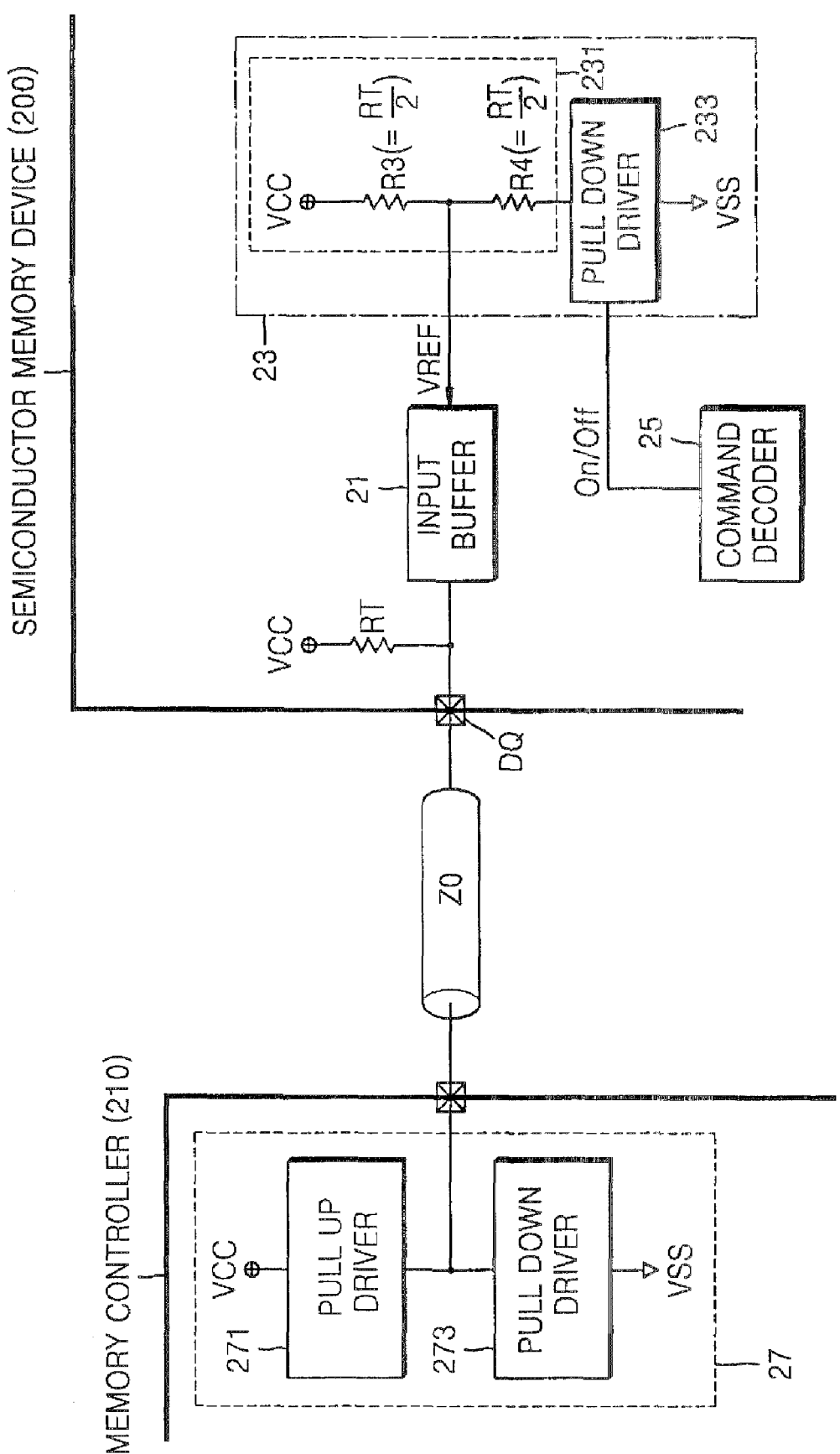
FIG. 2 is a block diagram of a semiconductor memory device including an internal reference voltage generating circuit according to an exemplary embodiment of the present invention.

FIG. 2 is a block diagram of a semiconductor memory device 200 including an internal reference voltage generating circuit 23 according to an exemplary embodiment of the present invention. For the sake of descriptive convenience, a memory controller 210 that controls the semiconductor memory device 200 is illustrated.

Referring to FIG. 2, the semiconductor memory device 200 includes an input end DQ, an on die termination (ODT) resistor RT connected to the input end DQ, and an input buffer 21 that receives a signal input from the input end DQ based on a reference voltage VREF, wherein the internal reference voltage generating circuit 23 that generates the reference voltage VREF.

The input buffer 21 is a data input buffer that receives a data signal. When the semiconductor memory device 200 is a synchronous DRAM, the input buffer 21 can be the data input buffer or a data strobe input buffer that receives a data strobe signal.

The internal reference voltage generating circuit 23 includes a voltage dividing circuit 231 that outputs the reference voltage VREF by distributing voltages, and a pull down driver 233 that is connected to an end of the voltage dividing circuit 231. The pull down driver 233 is turned on or off according to an externally applied command. More specifically, if a write command (not shown) is applied from the outside, a command decoder 25 decodes the write command and controls the pull down driver 233 to be turned on. If a command other than the write command is applied from the outside, the command decoder 25 controls the pull down driver 233 to be turned off.

The voltage dividing circuit 231 includes a plurality of resistors that are serially connected between a power voltage VCC and the pull down driver 233, and outputs the reference voltage VREF from one of the connection points of the plurality of resistors. The total sum of values of the plurality of resistors is the same as a value of the ODT RT.

In this exemplary embodiment, the voltage dividing circuit 231 includes first and second resistors R3 and R4. A value of the first resistor R3 is the same as a half of the value of the ODT RT (RT/2). A value of the second resistor R4 is also the same as a half of the value of the ODT RT (RT/2). Therefore, the total sum of the values of the first and second resistors R3 and R4 is the same (RT) as the value of the ODT RT. The voltage dividing circuit 231 outputs the reference voltage VREF from a connection point of the first and second resistors R3 and R4.

The pull down driver 233 has the same on resistor value as an on resistor value of a pull down driver 273 of an output driver 27 of the memory controller 210 that transmits data to the input DQ of the semiconductor memory device 200 over a transmission line ZO. The output driver 27 of the memory controller 210 includes a pull up driver 271 and the pull down driver 273.

For example, if the value of the ODT RT is 60 ohms, and the on resistor value of the pull down driver 273 of the output driver 27 of the memory controller 210 is 60 ohms, the values of the first and second resistors R3 and R4 are each 30 ohms, and the on resistor value of the pull down driver 233 is 60 ohms. If the write command is applied from outside, the command decoder 25 turns on the pull down driver 233. In this exemplary embodiment, if the power voltage VCC is 10 volts, the reference voltage VREF is 1.35 volts.

When the memory controller 210 writes logic low data to the semiconductor memory device 200, since the pull down driver 273 of the output driver 27 of the memory controller 210 is turned on, the logic low data over the transmission line ZO is 0.9 volts. When the memory controller 210 writes logic high data to the semiconductor memory device 200, since the pull up driver 271 of the output driver 27 of the memory controller 210 is turned on, the logic high data over the transmission line ZO is 1.8 volts.

Therefore, the reference voltage VREF is half (1.35) of the voltage (0.9) of the logic low data and the voltage (1.8) of the logic high data.

The internal reference voltage generating circuit 23 of the exemplary embodiment of the present invention is operated when the write command is applied from outside the semiconductor memory device 200, thereby reducing a standby current. Also, the internal reference voltage generating circuit 23 of the current embodiment of the present invention is included in the semiconductor memory device 200, thereby reducing the number of pins required on the semiconductor memory device 200.

Figure 3:
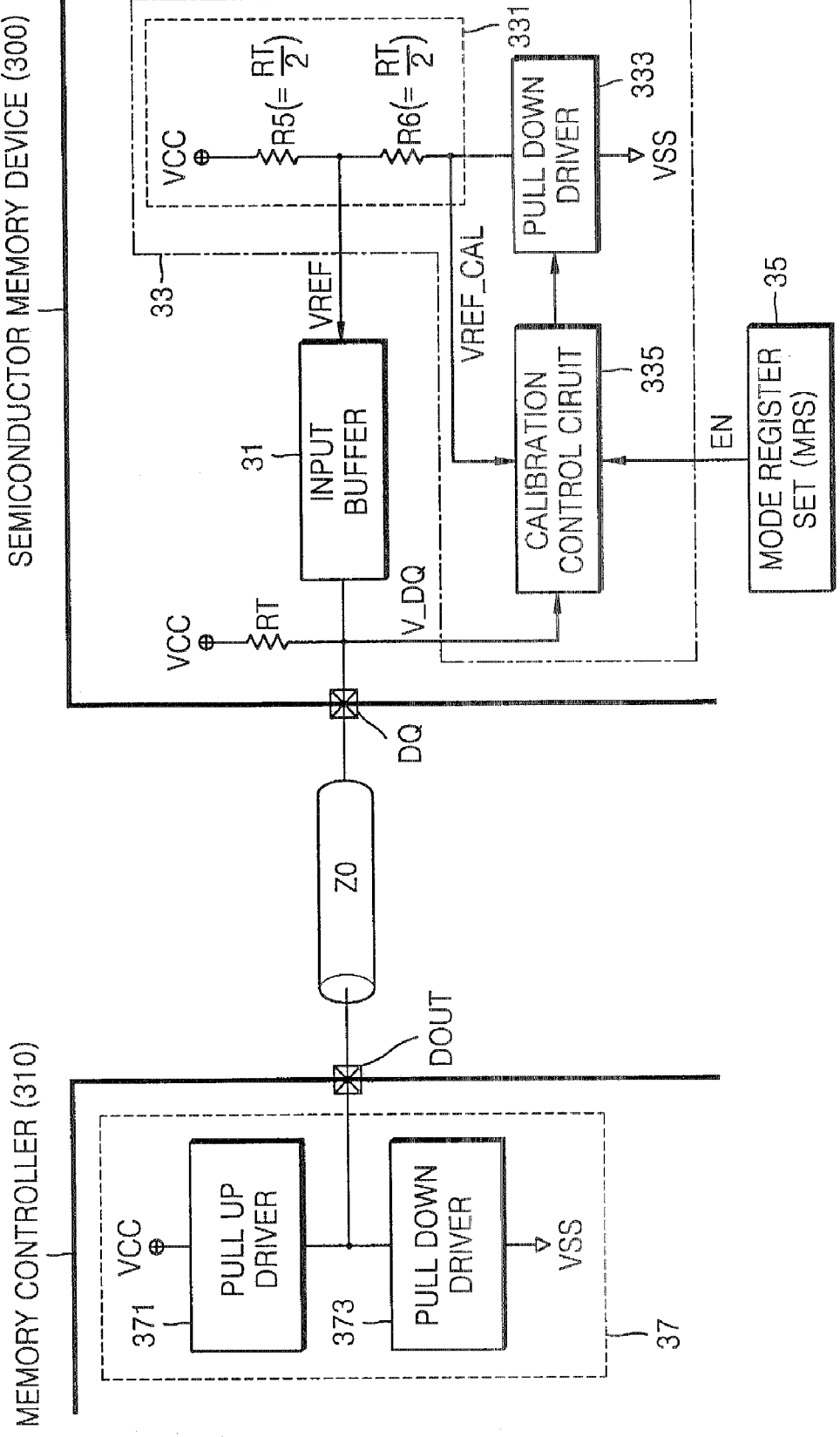
FIG. 3 is a block diagram of a semiconductor memory device including an internal reference voltage generating circuit according to an exemplary embodiment of the present invention.

FIG. 3 is a block diagram of a semiconductor memory device 300 including an internal reference voltage generating circuit 33 according to an exemplary embodiment of the present invention. For the sake of descriptive convenience, a memory controller 310 that controls the semiconductor memory device 300 is illustrated.

Referring to FIG. 3, the semiconductor memory device 300 includes an input DQ, an ODT resistor RT connected to the input DQ, an input buffer 31 that receives a signal input from the input end DQ based on a reference voltage VREF, the internal reference voltage generating circuit 33 that generates the reference voltage VREF, and a mode register set (MRS) 35 that enables or disables the internal reference voltage generating circuit 33.

The input buffer 31 is a data input buffer that receives a data signal. When the semiconductor memory device 300 is a synchronous DRAM, the input buffer 31 can be the data input buffer or a data strobe input buffer that receives a data strobe signal.

The internal reference voltage generating circuit 33 includes a voltage dividing circuit 331 that outputs the reference voltage VREF by distributing voltages, a pull down driver 333 that is connected to an end of the voltage dividing circuit 331, and a calibration control circuit 335 that compares a voltage level V_DQ of the input DQ and a voltage level VFRE_CAL of an end of the voltage dividing circuit 331, and controls an on resistor value of the pull down driver 333 according to a result of the comparison.

An output signal EN of the MRS 35 controls the calibration control circuit 335. If the memory controller 310 inputs a signal (not shown) to the MRS 35 to enable the internal reference voltage generating circuit 33, the output signal EN of the MRS 35 is activated, and accordingly the calibration control circuit 335 is enabled so that the internal reference voltage generating circuit 33 is operated.

The constitution of the operation of the internal reference voltage generating circuit 33 will now be described in detail with reference to FIG. 4.

Figure 4:
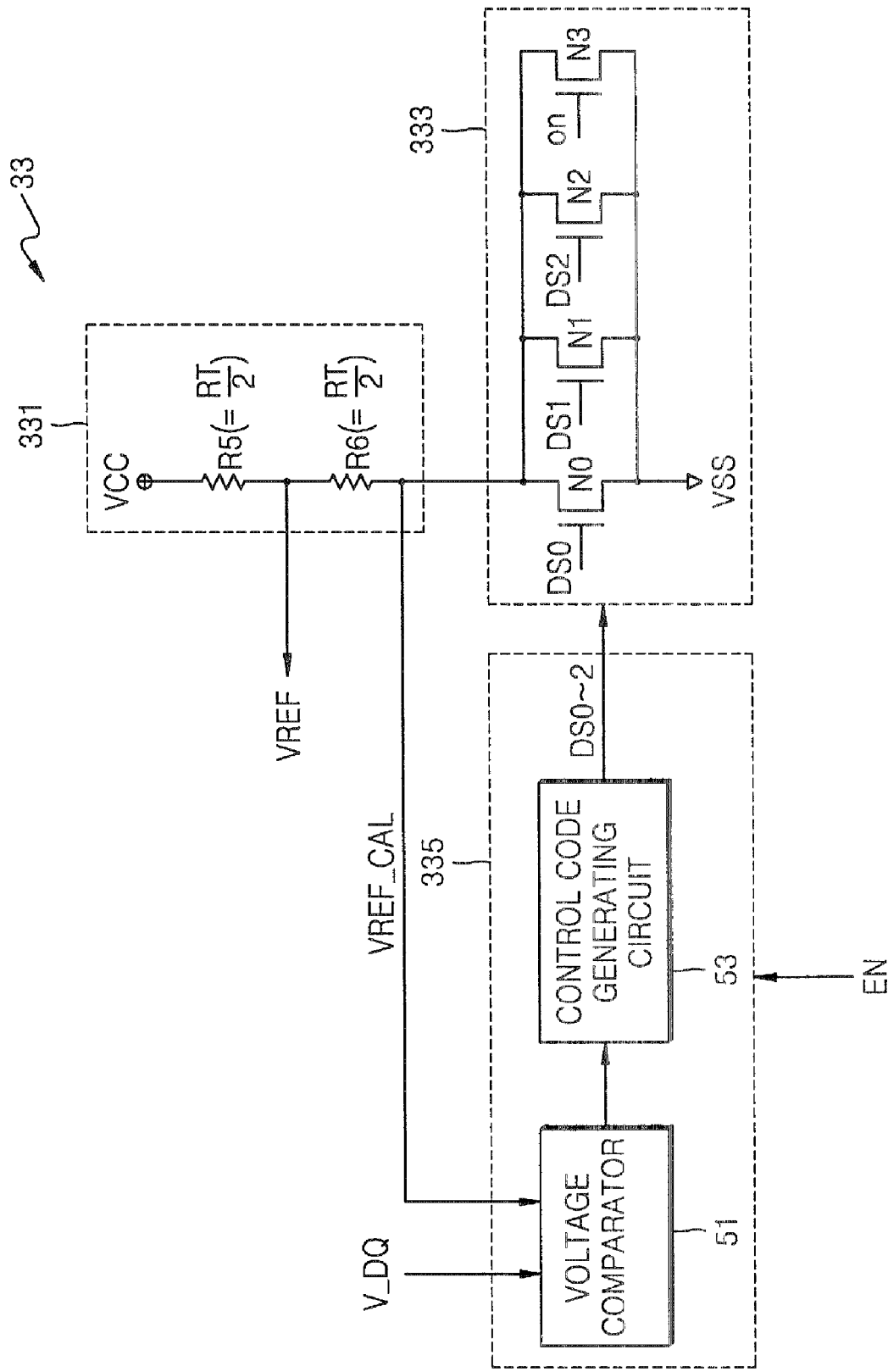
FIG. 4 is a block diagram of the internal reference voltage generating circuit illustrated in FIG. 3.

FIG. 4 is a block diagram of the internal reference voltage generating circuit 33 illustrated in FIG. 3. Referring to FIG. 4, the voltage dividing circuit 331 includes a plurality of resistors that are serially connected between a power voltage VCC and the pull down driver 333, and outputs the reference voltage VREF from one of the connection points of the plurality of resistors. The sum of the values of the plurality of resistors is the same as the value of the ODT RT in FIG. 3.

The voltage dividing circuit 331 includes first and second resistors R5 and R6. A value of the first resistor R5 is the same as a half of the value of the ODT RT (RT/2). A value of the second resistor R6 is the same as the half of the value of the ODT RT (RT/2). Therefore, the sum of the values of the first and second resistors R5 and R6 is the same (RT) as the value of the ODT RT. The voltage dividing circuit 331 outputs the reference voltage VREF from a contact point of the first and second resistors R5 and R6.

The pull down driver 333 is connected in parallel to an end of the voltage dividing circuit 331 and the ground voltage VSS, and includes a plurality of pull down transistors N0 through N2 that are turned on or off in response to control code signals DS0 through DS2, respectively. If occasion demands, the pull down driver 333 further includes a pull down transistor N3 that is always turned on. The pull down transistors N0 through N3 are NMOS transistors.

The calibration control circuit 335 controls the pull down driver 333 to have the same on resistor value as that of the pull down driver 373 of the output driver 37 of the memory controller 310 illustrated in FIG. 3. The output driver 37 of the memory controller 310 includes the pull up driver 371 and the pull down driver 373.

The calibration control circuit 335 includes a voltage comparator 51 and a control code generating circuit 53. The voltage comparator 51 compares a voltage level V_DQ of the input end DQ and a voltage level VREF_CAL of an end of the voltage dividing circuit 331. The control code generating circuit 53 generates the plurality of control code signals DS0 through DS2 in response to outputs of the voltage comparator 51 and latches the control code signals DS0 through DS2.

The operation of the internal reference voltage generating circuit 33 will now be described. If the memory controller 310 inputs a signal to the MRS 35 to enable the internal reference voltage generating circuit 33, the output signal EN of the MRS 35 is activated, and accordingly the calibration control circuit 335 is enabled so that the internal reference voltage generating circuit 33 is operated.

When the pull down driver 373 of the memory controller 310 is turned on, the voltage comparator 51 compares the voltage level V_DQ of the input end DQ and the voltage level VREF_CAL of the end of the voltage dividing circuit 331. It is assumed that the voltage level V_DQ of the input end DQ is virtually identical to a voltage level of an output end DOUT of the memory controller 310.

As a result of the comparison, if the voltage level VREF_CAL of the end of the voltage dividing circuit 331 is lower than the voltage level V_DQ of the input end DQ, the control code generating circuit 53 generates the control code signals DS0 through DS2 to increase the on resistor value of the pull down driver 333, that is, to reduce the number of the turned-on pull down transistors DS0 through DS2. If the on resistor value of the pull down driver 333 is increased, that is, if the number of the turned-on pull down transistors DS0 through DS2 is reduced, the voltage level VREF_CAL of the end of the voltage dividing circuit 331 is increased.

If the voltage level VREF_CAL of the end of the voltage dividing circuit 331 is higher than the voltage level V_DQ of the input end DQ, the control code generating circuit 53 generates the control code signals DS0 through DS2 to reduce the on resistor value of the pull down driver 333, that is, to increase the number of the turned-on pull down transistors DS0 through DS2. If the on resistor value of the pull down driver 333 is reduced, that is, if the number of the turned-on pull down transistors DS0 through DS2 is increased, the voltage level VREF_CAL of the end of the voltage dividing circuit 331 is reduced.

The operation is repeated until the voltage level VREF_CAL of the end of the voltage dividing circuit 331 is identical to the voltage level V_DQ of the input end DQ. This means that the on resistor value of the pull down driver 333 is the same as the on resistor value of the pull down driver 373 of the output driver 37 of the memory controller 310.

For example, if the value of the ODT RT is 60 ohms, the values of the first and second resistors R5 and R6 are 30 ohms. If the power voltage VCC is 1.8 volts and the voltage level V_DQ of the input end DQ is 0.9 volts, the voltage level VREF_CAL of the end of the voltage dividing circuit 331 is 0.9 volts and, thus, the reference voltage VREF is 1.35 volts.

Therefore, the reference voltage VREF is half (1.35) of the sum of the voltage (0.9) of the logic low data and the voltage (1.8) of the logic high data.

The internal reference voltage generating circuit 33 of the exemplary embodiment of the present invention is operated while the memory controller 37 inputs the signal (not shown) into the MRS 35 to enable the internal reference voltage generating circuit 33 and the output signal EN of the MRS 35 is activated. Also, the internal reference voltage generating circuit 33 of the exemplary embodiment of the present invention is included in the semiconductor memory device 300, thereby reducing the number of pins required for the semiconductor memory device 300.

According to exemplary embodiments of the present invention, an internal reference voltage generating circuit can reduce a standby current and the number of pins of a semiconductor memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An internal reference voltage generating circuit of a semiconductor memory device providing a reference voltage to an input buffer that receives a signal through an input to which an on die termination (ODT) resistor is connected, the circuit comprising:
   a voltage dividing circuit arranged in the semiconductor memory device and outputting the reference voltage by dividing a power-supply voltage; and
   a pull down driver arranged in the semiconductor memory device and connected to an end of the voltage dividing circuit,
   wherein the semiconductor memory device is void of a reference voltage input pin, and
   wherein the pull down driver is turned on in a memory write operation according to a write command applied from the outside the semiconductor memory device.

2. The internal reference voltage generating circuit of claim 1, wherein the voltage dividing circuit comprises: a plurality of resistors serially connected between the power-supply voltage and the pull down driver,
   wherein the reference voltage is output from one connection point of the plurality of resistors, and a sum of values of the plurality of resistors is the same as a value of the ODT resistor.

3. The internal reference voltage generating circuit of claim 1, wherein the voltage dividing circuit comprises:
   a first resistor having an end connected to the power-supply voltage and having a value half of a value of the ODT resistor; and
   a second resistor having an end connected to the other end of the first resistor and the other end connected to the pull down driver and having a value half of the value of the ODT resistor,
   wherein the reference voltage is output from a connection point of the first and second resistors and a sum of values of the first and second resistors is the same as the value of the ODT resistor.

4. The internal reference voltage generating circuit of claim 1, wherein when the command is a write command the pull down driver is turned on.

5. The internal reference voltage generating circuit of claim 1, wherein the pull down driver has a same on resistor value as an on resistor value of a pull down driver of an output driver of a memory controller that transmits data to the input of the semiconductor memory device.

6. A semiconductor memory device comprising:
   an input receiving a data signal;
   an on die termination (ODT) resistor connected to the input;
   an input buffer that receives the data signal through the input based on a reference voltage fed thereto; and
   an internal reference voltage generating circuit that generates the reference voltage,
   wherein the internal reference voltage generating circuit includes:
     a voltage dividing circuit outputting the reference voltage by dividing a power-supply voltage;
     a pull down driver connected to an end of the voltage dividing circuit,
     wherein the semiconductor memory device is void of a reference voltage input, and
     wherein the pull down driver is turned on in a memory write operation according to a write command applied from the outside the semiconductor memory device.

7. The semiconductor memory device of claim 6, wherein the voltage dividing circuit comprises: a plurality of resistors serially connected between the power-supply voltage and the pull down driver,
   wherein the reference voltage is output from one connection point of the plurality of resistors, and a sum of values of the plurality of resistors is the same as a value of the ODT resistor.

8. The semiconductor memory device of claim 6, wherein the voltage dividing circuit comprises:
   a first resistor having an end connected to the power-supply voltage, and having a value half of a value of the ODT resistor; and
   a second resistor having an end connected to the other end of the first resistor and the other end connected to the pull down driver, and having a value half of the value of the ODT resistor,
   wherein the reference voltage is output from a connection point of the first and second resistors and a sum of the values of the first and second resistors is the same as the value of the ODT resistor.

9. The semiconductor memory device of claim 6, wherein when the command is a write command the pull down driver is turned on.

10. The semiconductor memory device of claim 6, wherein the pull down driver has a same on resistor value as an on resistor value of a pull down driver of an output driver of a memory controller that transmits data to the input.

* * * * *